United States Patent [19]
Tokami et al.

[11] Patent Number: 5,430,686
[45] Date of Patent: Jul. 4, 1995

[54] SEMICONDUCTOR MEMORY DEVICE AND OPERATING METHOD THEREOF

[75] Inventors: Kenji Tokami; Yoshinori Inoue, both of Hyogo, Japan

[73] Assignee: Mitsubishi Denki Kabushiki Kaisha, Tokyo, Japan

[21] Appl. No.: 961,284

[22] Filed: Oct. 15, 1992

[30] Foreign Application Priority Data

Jul. 9, 1992 [JP] Japan ................... 4-182260

[51] Int. Cl.$^6$ .............................................. G11C 8/00
[52] U.S. Cl. ............................ 365/230.08; 365/63; 365/214; 365/230.01; 365/230.04; 365/239
[58] Field of Search ..................... 365/230.08, 189.01, 365/230.01, 230.04, 230.09, 239, 164, 214, 51, 63

[56] References Cited

U.S. PATENT DOCUMENTS

| | | | |
|---|---|---|---|
| 4,686,650 | 8/1987 | Hori et al. | 365/230.02 |
| 4,807,192 | 2/1989 | Nakano et al. | 365/230.02 |
| 4,870,620 | 9/1989 | Yamagata et al. | 365/230.08 |
| 4,931,998 | 6/1990 | Ootani et al. | 365/230.01 |
| 4,941,129 | 7/1990 | Oshima et al. | 365/230.02 |
| 4,951,258 | 8/1990 | Uehara | 365/230.08 |
| 5,105,389 | 4/1992 | Matsuo et al. | 365/230.01 |
| 5,185,719 | 2/1993 | Dhong et al. | 365/230.01 |
| 5,226,139 | 7/1993 | Fujishima et al. | 365/230.03 |
| 5,241,510 | 8/1993 | Kobayashi et al. | 365/230.08 |
| 5,260,895 | 11/1993 | Shishikura | 365/230.01 |
| 5,274,594 | 12/1993 | Yanagisawa et al. | 365/225.7 |

FOREIGN PATENT DOCUMENTS

| | | |
|---|---|---|
| 59139646 | 12/1984 | Japan . |
| 6018894 | 6/1985 | Japan . |
| 63200556 | 12/1988 | Japan . |

OTHER PUBLICATIONS

Lu et al, "A 20-ns 128-kbit×4 High-Speed DRAM with 330-Mbit/s Data Rate", *IEEE Journal of Solid-State Circuits*, vol. 23, No. 5 (October 1988), pp. 1140-1149.

*Primary Examiner*—Joseph A. Popek
*Assistant Examiner*—Tan Nguyen
*Attorney, Agent, or Firm*—Lowe, Price, LeBlanc & Becker

[57] ABSTRACT

In a DRAM, buffer circuits constituting a column address buffer are provided near address input pads receiving external address signals to be input thereto, and switch circuits arranged near the address input pads are connected between the address input pads and a row address buffer. Driving capability of each buffer circuits is set larger than in the prior art. Each switch circuit is controlled to be OFF while a column address signal is being supplied to a corresponding one of the address input pads. While the column address signal is externally applied to the address input pads, the capacitance and resistance of the interconnection layer which affects the waveform of the internal column address signal can be reduced, and hence time required for selecting one column of memory cells in each of memory cell array blocks in response to the external column address signal can be reduced, thus reducing the access time in the DRAM.

13 Claims, 6 Drawing Sheets

SEMICONDUCTOR MEMORY DEVICE AND OPERATING METHOD THEREOF

BACKGROUND OF THE INVENTION

1. Field of the Invention

The present invention relates to a semiconductor memory device and method of operating the same, and more specifically to a semiconductor memory device having large number of input pins to receive external address signals and operating method thereof.

2. Description of the Background Art

Memory capacities of semiconductor memory devices, especially of DRAMs (Dynamic Random Access Memories) have been further increased recently. As the capacity is increased, chip area of a DRAM has come to be larger and larger, and the bit length of an address signal for specifying a memory cell to which data is to be written or from which data is to be read becomes longer and longer.

Generally, a DRAM having large storage capacity has a memory cell array divided into a plurality of blocks. FIG. 6 is a schematic block diagram showing the whole structure of a conventional DRAM having large capacity. In the example of FIG. 6, the memory cell array is divided into two blocks.

The structure and operation of the conventional DRAM having large capacity will be described with reference to FIG. 6.

Each of the memory cell array blocks 2a and 2b includes a plurality of memory cells MC arranged in a matrix of a plurality of rows and a plurality of columns, a plurality of word lines WL provided corresponding to the plurality of rows, and a plurality of bits lines BL1, BL2 provided corresponding to the plurality of columns.

A memory cell MC connected to one of the adjacent two bit lines BL1 and BL2 and a memory cell MC connected to the other one of the bit lines are connected to different word lines WL. The adjacent two bit lines BL1 and BL2 constitute one bit line pair BL.

Column decoders 24a and 24b, row decoders 25a and 25b, and sense amplifier. IO line circuits: 26a, 26b are provided corresponding to memory cell array blocks 2a and 2b, respectively.

A column predecoder 6 and a column address buffer 21 are provided commonly corresponding to the column decoders 24a and 24b.

Similarly, a row predecoder 4 and a row address buffer 3 are provided commonly corresponding to the row decoders 25a and 25b.

Address signals Aa, Ab and Ac externally applied to address input pads 10a, 10b and 10c are applied to each of the column address buffer 21 and the row address buffer 3.

Although three pads are shown as representing address input pads, actually a larger number of pads are provided as address input pads in a DRAM 1 having large capacity. For example, at least 11 address input pads are provided on a DRAM chip having the capacity of 4M. The address input pads receive the data of respective bits of the external address signal in parallel (multiple address input method).

The row address buffer 3 and the column address buffer 21 are controlled by a row address strobe signal/RAS and a column address strobe signal/CAS which are external control signals. In the specification "/" added before reference characters representing signals indicates that the signal is a low active signaL.

A control signal input pad 22 and a buffer 28 are provided for supplying external row address strobe signal/RAS to the row address buffer 3. Similarly, a control signal input pad 23 and a buffer 29 are provided for supplying an external column address strobe signal/CAS to the column address buffer 21.

The RAS buffer 28 buffers the row address strobe signal/RAS externally applied to the pad 22 and it applies the buffered signal to the row address buffer 3. The output signal from the RAS buffer 28 is hereinafter referred to as an internal row address strobe signal int/RAS.

Similarly, the CAS buffer 29 buffers the column address strobe signal/CAS externally applied to the pad 23 and it applies the buffered signal to the column address buffer 21. The output signal from the CAS buffer 29 will be hereinafter referred to as the internal column address strobe signal int/CAS.

The column address buffer 21 buffers the external address signals Aa–Ac from address input pads 10a–10c and supplies the buffered signals to the column predecoder 6 and an ATD (Address Transition Detector) circuit 7 while the internal column address strobe signal int/CAS from the buffer 29 is at a low level. The signal applied from the column address buffer 21 to the column predecoder 6 and to the ATD circuit 7 will be hereinafter referred to as an internal column address signal intAcl.

Meanwhile, the row address buffer 3 takes and temporarily stores external address signals Aa–Ac from address input pads 10a–10c in response to the fall of the internal row address strobe signal int/RAS from the buffer 29.

The signals stored in the row address buffer 3 are applied to a row predecoder 4. In the following description, a signal applied from the row address buffer 3 to the row predecoder 4 will be referred to as an internal row address signal intArw.

The column address buffer 21 includes a plurality of buffer circuits 210 provided corresponding to all address input pads 10a–10c. Each buffer circuit 210 operates while the internal column address strobe signal int/CAS is at the low level so that the external address signal from the corresponding address input pad is buffered and applied to the column predecoder 6 and the ATD circuit 7.

Similarly, the row address buffer 3 includes a plurality of buffer circuits 300 provided corresponding to all address input pads 10a–10c. Each buffer circuit 300 takes and temporarily stores the external address signal from the corresponding address input pad in response to the fall of the internal row address strobe signal int/RAS. The signal stored in each buffer circuit 300 is applied to the row predecoder 4.

The column predecoder 6 decodes the internal column address signal intAcl from the column address buffer 21 and applies the decoded signal to column decoders 24a and 24b.

The row predecoder 4 decodes the internal row address signal intArw from the row address buffer 3 and applies the decoded signal to the row decoders 25a and 25b.

The column decoder 24a further decodes the signal which has been decoded by the column predecoder 6, and to electrically connect only one corresponding pair of the bit line pairs BL in the memory cell array block 2a to the sense amplifier. IO line 26a.

Similarly, column decoder 24b further decodes the signal which has been decoded by the column predecoder 6, to electrically connect only one corresponding pair of the bit line pairs BL in the memory cell array block 2b to the sense amplifier. IO line 26b.

Row decoder 25a further decodes the signal from the row predecoder 4 to activate only one corresponding word line WL in the memory cell array 2a.

Similarly, the row decoder 25b further decodes the signal from the row predecoder 4 to activate only one corresponding word line WL in the memory cell array block 2b.

Writing and reading data to and from each memory cell MC can be carried out only when the word line WL connected to that memory cell is active.

Corresponding to the data stored in each memory cell MC connected to the word line WL which is active, the potential of the bit line BL1 or BL2 connected to the memory cell changes slightly. Consequently, there is generated a slight potential difference between the bit lines BL1 and BL2 constituting each bit line pair BL. In data reading, the sense amplifier. IO line circuit amplifies this slight potential difference and applies the amplified difference to an input/output circuit 27.

In data writing, sense amplifier. IO line circuit operates to force the potential of the bit line BL1 and the potential of the bit line BL2 which constitute a pair to complementary potentials corresponding to the data signal from the input/output circuit 27. The data stored in each memory cell MC connected to the word line WL which is active is rewritten by the data corresponding to the potential of the bit line BL1 or BL2 connected to that memory cell after the potentials are forced in such manner.

The input/output circuit 27 externally applies the output signals from sense amplifier. IO line circuits 26a and 26b as read data Dout through pads, not shown, in data reading. In data writing, the input/output circuit 27 supplies the data signal Din externally applied to the pads to the sense amplifier. IO line circuits 26a and 26b.

In data reading and data writing, row decoders 25a and 25b activate only one word line WL in the corresponding memory cell array blocks 2a and 2b, respectively, and each of the column decoders 24a and 24b electrically connects only one set of bit line pair BL in the corresponding memory cell array block 2a or 2b to the corresponding sense amplifier. IO line circuits 26a or 26b. Therefore, in data reading, data stored in one memory cell MC connected to the active word line WL and to either bit line BL1 or BL2 constituting the bit line pair BL electrically connected to the sense amplifier. IO line circuits 26a and 26b is externally read in each of the memory cell arrays 2a and 2b, respectively through the input/output circuit 27.

In data writing, external data is written to only one memory cell connected to the active word line WL and to either the bit line BL1 or BL2 constituting the bit line pair BL electrically connected to each of the sense amplifier. IO line circuits 26a and 26b, in each of the memory cell array blocks 2a and 2b, respectively through the input/output circuit 27. As to which word line WL is to be rendered active and which bit line pair BL is to be electrically connected to the sense amplifier. IO line circuits 26a and 26b, in each of the memory cell array blocks 2a and 2b it is determined dependent on the internal row address signal intArw from the row address buffer 3 and the internal column address signal intAcl from the column address buffer 21. Therefore, in each of the memory cell array blocks 2a and 2b, data is written to or read from a memory cell MC arranged at an intersection of a row designated by the external address signals Aa–Ac of the address input pads 10a–10c at the fall of the internal row address strobe signal int/RAS and a column designated by the external address signals Aa–Ac applied to the address input pads 10a–10c while the internal column address strobe signal int/CAS is at the low level.

The data stored in the DR extinguishes as time passes while the power is on. Therefore, it is necessary to prevent extinction of the data in the memory cell by rewriting the data same as the stored data in the memory cell MC at a timing earlier than the disappearance of the data stored in the memory cell MC. Such rewriting of data is called refreshing of data.

The internal address counter 5 successively generates address signals designating all rows of memory cells in each of the memory cell array blocks 2a and 2b and supplies these signals to the row address buffer 3.

The internal address counter 5 is provided for rewriting data in a prescribed period to each memory cell MC for refreshing data.

More specifically, the internal address counter 5 includes counters 500 provided corresponding to respective buffer circuits 300 in the row address buffer 3.

Each counter 500 outputs an address signal of the same bit as the external address signal (any one of Aa–Ac) to be supplied to the address input pad (any one of 10a–10c) connected to the corresponding buffer circuit 300. As a result, a row address signal of a plurality of bits designating any one row of the memory cells in each memory cell array block 2a or 2b is supplied to the row address buffer 3 not only from the address input pads 10a–10c but also from the internal address counter 5.

The row address buffer 3 takes the signals from the internal address counter 5 and applies the signals to the row predecoder 4 instead of the signals from the address input pads 10a–10c while the internal row address strobe signal int/RAS and the internal column address strobe signal int/CAS are both at the high level, that is, in a period in which neither data writing nor data reading is carried out to or from any memory cell MC.

Therefore, in such a period, the word line WL corresponding to the row designated by the output signal from the internal address counter 5 is activated in each of the memory cell array blocks 2a and 2b, and hence the data stored in all memory cells MC are refreshed.

The ATD circuit 7 detects the change in the internal column address signal intAcl and outputs a one shot pulse detecting signal. The circuitry which is to be controlled by the external column address signal/CAS such as column decoders 24a and 24b starts series of operations for writing or reading data in response to the detection signal.

The ATD circuit 7 is provided for controlling operation timings of circuits which are to be controlled by the external address strobe signal/CAS.

Most of such DRAMs having large capacities have various high speed operation modes so as to reduce access time. FIG. 7 is a timing chart showing timings of switching of the control signals, address signals and output data signals in the typical high speed operation modes of the DRAM.

Referring to FIG. 7, in a static column mode, the external row address strobe signal/RAS falls earlier than the external column address strobe signal/CAS (FIG. 7(a), (b)).

The external address signals Aa–Ac are set as the row address signals Row designating one row of memory cells in each of the memory cell array blocks 2a and 2b when the external row address strobe signal/RAS falls, while they are successively switched to column address signals Col-1, Col-2, . . . designating a plurality of columns of memory cells in each of the memory cell array blocks 2a and 2b while the external column address strobe signal/CAS is at the low level.

Therefore, as shown in FIG. 7(d), the internal row address signal intArw from the row address buffer 3 is fixed as a signal Row corresponding to the row of memory cells designated by the external address signals Aa–Ac at the time of the fall of the external address strobe signal/RAS.

The internal column address signal intAcl from the column address buffer 21 is successively switched to signals Col-1, Col-2, . . . successively designating the plurality of columns of the memory cells in each of the memory cell blocks 2a and 2b while the internal row address signal intArw is thus fixed, as shown in FIG. 7(e).

Therefore, in data reading, in the static column mode, data stored in the plurality of memory cells arranged in a single row designated by the external address signals Aa–Ac at the fall of the external row address strobe signal/RAS are supplied in the order of the data stored in the memory cell of the column designated by the signal Col-1, the data stored in the memory cell of the column designated by the signal Col-2, . . . as the output data Dout (FIG. 7(f)) of the DRAM, through the corresponding one of the sense amplifier. IO line circuits 26 and 26b and through the input/output circuit 27 from the corresponding one of memory cell array blocks 2a and 2b.

When the external address signals Aa–Ac are switched to the signals designating another column, the internal column address intAcl is switched to the signal designating this another column by the operation of the column address buffer 21, and then the signals appeared on the bit line pair BL corresponding to this another column in each of the memory cell array blocks 2a and 2b are applied to the input/output circuit 27 by the operation of the column predecoder 6 and column decoders 24a and 24b.

In the fast page mode, the external row address strobe signal/RAS and the external column address strobe signal/CAS fall in the similar timing as in the static column mode. However, different from the static column mode, the external column address strobe signal/CAS rises and falls repeatedly at predetermined timings while the external row address strobe signal/RAS is at the low level, as shown by the dotted line in FIG. 7(b).

Meanwhile, external address signals Aa–Ac are set as the signal Row designating one column of memory cells in each of the memory cell array blocks 2a and 2b at the fall of the external row address strobe signal/RAS, and these signals are set as the signal designating any one column of memory cells in each of the memory cell array blocks 2a and 2b at a timing synchronized with the fall of the external column address strobe signal/CAS as shown by the dotted line in FIG. 7(c).

Therefore, the internal row address signal intArw is fixed at a signal designating the column Row designated by the external address signals Aa–Ac at the fall of the external row address strobe signal/RAS, while the internal column address signal intAcl is switched to signals Col-1, Col-2, . . . designating a plurality of columns of memory cells at a timing synchronized with the external address strobe signal/CAS while the internal row address signal intArw is fixed at such a signal, as shown by the dotted line in FIG. 7(e).

Consequently, in data reading, the data stored in the plurality of memory cells MC arranged in the same row in each of the memory cell array blocks 2a and 2b are successively supplied externally as output data Dout at a timing corresponding to the period of the external column address strobe signal/CAS (see the dotted line of FIG. 7(f)).

Generally, in the static column mode or the fast page mode, the time $T_{AA}$ from the switching of the external address signals Aa–Ac to the signal designating another column of the memory cell, to the switching of the output data Dout to the data stored in the memory cells of this another column is called an access time.

Therefore, if it takes longer for the internal column address signal intAcl to switch in response to the switch of the external address signals Aa–Ac, the access time $T_{AA}$ becomes longer.

FIG. 8 is a schematic diagram showing a general structure of each buffer circuit 210 constituting the column address buffer 21.

Referring to FIG. 8, each buffer circuit 210 constituting the column address buffer includes a P channel MOS transistor 2000 and an N channel MOS transistor 2200 connected in series between the power supply Vcc and the ground, an inverter 2400 for inverting the potential at a node N1 between transistors 2000 and 2200, a P channel MOS transistor 2100 connected between the node N1 and the power supply Vcc, and an N channel MOS transistor 2300 connected between the node N1 and the ground GND.

Transistors 2000 and 2200 form an inverter INV of an input first stage of the buffer circuit.

An output signal from the inverter 2400 is applied to the gate of the transistor 2100. A control signal $\phi$ is applied to the gate of the transistor 2300.

The control signal $\phi$ is set such that it is switched from the high level to the low level after the signals from the address input pads 10a–10c are stored in the row address buffer 3 in response to the fall of the external row address strobe signal/RAS.

When the external address signal (any of Aa–Ac) to any one of the address input pads (any of 10a–10c) is changed from high level to the low level while the control signal $\phi$ is at the low level, the transistors 2000 and 2200 are turned from ON to OFF in the buffer circuit 210 provided corresponding to this one address input pad, so that the potential at the node N1 is switched from the low level to the high level, and the output signal from the inverter 2400 changes from the high level to the low level, in response. When the output signal from the inverter 2400 attains low level, the transistor 2100 turns ON, and therefore even when the control signal $\phi$ attains high level thereafter, the potential at the node N1 and the output signal from the inverter 2400 are fixed at the high level and the low level, respectively.

Conversely, when the external address signal to an arbitrary address input pad changes from the low level to the high level while the control signal $\phi$ is at the low level, the transistors 2000 and 2200 are turned OFF and ON, respectively, so that the potential at the node N1 is switched to the low level, resulting in the high level output signal from the inverter 2400 in the buffer circuit 210 provided corresponding to this address input pad. When the output signal from the inverter 2400 attains to the high level, the transistor 2100 is turned OFF, and therefore the output signals from the node N1 and the inverter 2400 are fixed at the high level and the low level, respectively, regardless of the level of the control signal $\phi$.

While the control signal $\phi$ is at the low level, in response to the switching of the external address signals Aa-Ac to the respective address input pads 10a-10c, the output levels of the buffer circuits 210 provided corresponding to the address input pads are switched. Namely, after the row address signal is taken by the row address buffer 3, the signals Aa-Ac of the respective bits constituting the column address signal are taken in the corresponding buffer circuits 210.

Generally, in each buffer circuit 210, the inverter 2400 is a CMOS type inverter similar to that of the inverter INV of the input first stage.

Generally, the relation (transmission characteristic) of the input potential level and the output potential level of the inverter INV is unified according to a standard specification.

More specifically, the output transition point of the inverter INV, that is, the value of the input potential to the inverter INV at which the output logic level of the inverter INV changes, is set at an intermediate potential between the range of the potential to be regarded as high level and the range of the potential to be regarded as the low level.

For example, in a DRAM, the minimum value of the potential range to be regarded as the high level and the maximum value of the potential range to be regarded as the low level are 2.4 V and 0.8 V, respectively, which values are determined in accordance with a standard. Therefore, the transition point (threshold value) of the output potential of the inverter INV is set at about 1.6 V.

Namely, in each buffer circuit 210, when the potential of the corresponding address input pad exceeds 1.6 V, the inverter INV outputs a low level potential, and when the potential of the corresponding address input pad becomes lower than 1.6 V, the inverter INV outputs a high level potential.

The threshold voltages and the like of the transistors 2000 and 2200 are set so that the inverter INV has such transmission characteristics.

Generally, in such a DRAM having the block divided structure, the row address buffer 3 and the column address buffer 21 are arranged between the memory cell array blocks 2a and 2b. When the memory cell array is divided into two blocks 2a and 2b, the column address buffer 21 and the row address buffer 3 are arranged between one memory cell array block 2a and the other memory cell array block 2b, that is, the central portion of the DRAM chip 1, as shown in FIG. 6.

As described above, in the conventional DRAM, the data of each of the bits constituting the row address and the data of each bit constituting the column address are input to decoders through corresponding buffer circuits. Therefore, the magnitude of the capacitance and resistance of the interconnection provided between each address input pad and the corresponding buffer circuit much influence the time necessary for transmission of the external address signal to the decoders.

For example, referring to FIG. 6, the buffer circuits 210 constituting the column address buffer 21 are connected to the corresponding address input pads 10a-10c by interconnection layers La-Lc formed on the chip 1, respectively.

The address input pads 10a-10c are provided near the outer side of the DRAM chip 1 in order to take external signals. The column address buffer 21 is provided at the central portion of the DRAM chip 1.

Therefore, the interconnection layers La-Lc connecting the address input pads 10a-10c to the corresponding buffer circuits 210 have the length corresponding to the length of one side of the DRAM chip.

Since DRAMs have come to have larger capacitances recently, the size of the DRAM chip 1 becomes larger as compared with the prior art. Therefore, the length of one side of the DRAM chip 1 is also made longer than the prior art. Consequently, the length of the interconnection layers La-Lc becomes longer.

The resistance and capacitance of the interconnection layer increase in proportion to the length. Therefore, in a recent DRAM1 having large storage capacity, the resistance and capacitance of the interconnection layers La-Lc connecting the address input pads 10a-10c with the column address buffer 21 are considerably large.

As the resistance and capacitance of the interconnection layers La-Lc become larger, the time necessary for the internal column address signal intAcl from the column address buffer 21 to change in response to the change of the external address signal Aa-Ac becomes longer.

This phenomenon will be described in detail with reference to FIGS. 8 and 9.

Assume that an external address signal Aa supplied to the address input pad 10a changes from the high level to the low level as shown in FIG. 9(a).

In such a case, for the output signal of the buffer circuit 210 provided corresponding to the address input pad 10a to be switched immediately in response to the switching of such external address signal Aa, it is necessary that the transistors 2000 and 2200 in the buffer circuit 210 (see FIG. 8) are switched to ON and OFF, respectively, at high speed.

However, if the interconnection layer La has large capacitance and large resistance, it takes long to discharge the interconnection layer in response to the switching of the external address signal Aa. Therefore, the potentials at the gates (input ends of the inverter INV) of the transistors 2000 and 2200 do not immediately lower even if the potential of the address input pad 10a (FIG. 9(a)) falls, as shown in FIG. 9(b), but the potential reaches the low level potential $V_{IL}$ considerably long after the external address signal Aa has attained the low level. Namely, the potential at the input end of the buffer circuit 210 has a waveform which is considerably moderate than the waveform of the external address signal Aa.

Therefore, the time $\tau 1$ necessary for the potential at the input end of the buffer circuit 210 to be regarded as the low level (not higher than 1.6 V) by the inverter INV of the input first stage becomes longer. Therefore, as shown in FIG. 9(c), the output signal from the inverter INV gradually increases in response to the lowering of the signal at the input end of the inverter INV and it reaches the high level potential $V_{IH}$ considerably long time after the fall of the external address signal Aa.

Consequently, the time $\tau 2$ necessary for the output signal from the inverter INV to attain the range (not lower than 1.6 V) to be regarded as the high level by the inverter 2400 also becomes longer. Therefore, as shown in FIG. 9(d), the output signal from the inverter 2400, that is, the internal column address signal intAcl gradually lowers in response to the rise of the output signal of the inverter INV and it reaches the ground potential Vss corresponding to the low level considerably long time after the fall of the external address signal Aa.

Assume that the external address signal Aa is switched from the low level to the high level as shown in FIG. 9(a).

In that case, for the internal address signal intAcl to be immediately switched in response to the switching of the external address signal Aa, it is necessary that the output signal of the inverter INV is immediately switched to the low level in the buffer circuit 210 provided corresponding to the address input pad 10a.

However, if the interconnection layer La has large capacitance and large resistance, it takes long to charge this interconnection layer in response to the switching of the external address signal Aa. Therefore, the potential at the input end of the inverter INV shows a waveform which is considerably moderate the than the external address signal Aa as shown in FIG. 9(a), and hence it takes long time τ3 for the potential to reach the range which is regarded as high level by the inverter INV.

Therefore, as shown in FIG. 9(c), the output signal from the inverter INV gradually lowers in response to the rise of the potential at the input end thereof and it reaches the low level potential $V_{IL}$ considerably long time after the rise of the external address signal Aa.

Consequently, since the time τ4 necessary for the output signal from the inverter INV to reach the range regarded as the low level by the inverter 2400 becomes longer, and the output signal from the inverter 2400 slowly rises in response to the lowering of the output signal from the inverter INV and reaches the supply potential Vcc corresponding to the high level, considerably long time after the rise of the external address signal Aa, as shown in FIG. 9(d).

As described above, if the interconnection layer La has large resistance and large capacitance, the time T1 necessary for the output signal of the buffer circuit 210 provided corresponding to the address input pad 10a to completely reach the low level and the time T2 necessary for the output signal of the buffer circuit 210 provided corresponding to the address input pad 10a to completely reach the high level, that is, the time necessary for the output level of the buffer circuit 210 provided corresponding to the address pad 10a to be switched in response to the change of the level of the external address signal Aa becomes longer.

Similarly, the increase of the resistance and of the capacitance of the interconnection layers Lb and Lc increase time necessary for the changes in the levels of the corresponding external address signals Ab and Ac to reach the corresponding internal address signals.

If it takes long to transmit the change of the external address signals Aa-Ac to the internal address signal intAcl, the time from the switching of the external address signal to electrical connection of one bit line pair BL provided corresponding to the column designated by the switched external address signal to the sense amplifier IO line circuit 26a or 26b by the operation of the column predecoder 6, column decoder 24a and the ATD circuit 7 in each of the memory cell array blocks 2a and 2b takes longer.

Therefore, in the fast page mode or a static column mode, for example, in the period after the external address signals Aa-Ac are taken as row addresses in the row address buffer 3 in response to the fall of the external row address strobe signal/RAS, the time (the time for data reading) necessary for the output data Dout from the input/output circuit 27 to be switched from the data stored in the memory cell MC arranged at one column to the data stored in the column of the memory cells MC arranged in another column in each of the memory cell array blocks 2a and 2b in response to the switching of the external address signals Aa-Ac indicating a certain column of memory cells to another column of memory cells, and the time (time for data writing) necessary for the external data Din to be written to one memory cell MC arranged in this another column in each of the memory cell array blocks 2a and 2b becomes longer in each of the memory cell array blocks 2a and 2b.

As described above, if the interconnection layer connecting the address input pad and the buffer circuit for taking the external address signal applied to this address input pad to apply the same to the decoder has large resistance and large capacitance, the waveform of the potential at the input end of the buffer circuit becomes moderate, resulting in longer access time of the DRAM.

Such moderate signal waveform of the input end of the buffer circuit caused by the increased resistance and capacitance of the interconnection layer also affects power consumption of the buffer circuit.

Referring to FIGS. 8 and 9, assume that the signal at the input end of the inverter INV slowly changes to the low level and to the high level in response to the fall and rise of the external address signal Aa, respectively, as shown in FIG. 9(b) in buffer circuit 210.

In such a case, both transistors 2000 and 2200 in the inverter INV are kept ON longer in the period from the potential at the input end of the inverter INV changes from the high level potential $V_{IH}$ to the low level potential $V_{IL}$ and in the period in which it changes from the low level potential $V_{IL}$ to the high level potential $V_{IH}$.

The threshold voltage of a MOS transistor is generally 0.8 V, for example, which is considerably smaller than the difference voltage between the high level potential $V_{IH}$ and the low level potential $V_{IL}$.

Therefore, the P channel transistor 2000 constituting the inverter INV is turned ON if the gate potential thereof is lower than or equal to a potential Vthp which is lower than the high level potential $V_{IH}$ by the threshold voltage Vthp, and the N channel transistor 2200 constituting the inverter INV is turned ON if the gate potential thereof is higher than or equal to a potential Vthn which is higher than the low level potential $V_{IL}$ by the threshold voltage.

Therefore, in the period in which the potential at the input end of the inverter INV is in the range from Vthn-Vthp, the transistors 2000 and 2200 are both ON. If the speed of lowering and increasing the potential at the input end at the inverter INV become slower, the period in which the gate potentials of the transistors 2000 and 2200 are in such a range Vthn-Vthp becomes longer. Namely, the period in which transistors 2000 and 2200 are both ON becomes longer.

In the period in which transistors 2000 and 2200 are both ON, there is generated a current flowing from the power supply Vcc to the ground through the transistors 2000 and 2200, that is, a through current. Therefore, if such period in which the transistors 2000 and 2200 are both ON becomes longer, the power consumption in the buffer circuit 210 is increased because of the increased through current in the inverter INV.

As described above, the increase of the resistance and capacitance of the interconnecting layer connecting the address input pad to the buffer circuit for buffering the external address signals cause increased power consumption of the buffer circuit, and as a result, it prevents reduction of power consumption in the DRAM.

As the storage capacity of the DRAMs has come to be larger and larger, the length of one side of the DRAM chip 1 has come to be longer. Therefore, the above described problem derived from the increased resistance and capacitance of the interconnection layers La-Lc become more serious in the recent DRAMs having large storage capacity.

SUMMARY OF THE INVENTION

An object of the present invention is to provide a semiconductor memory device in which the access time is reduced.

Another object of the present invention is to provide a semiconductor memory device in which power consumption is decreased.

A further object of the present invention is to provide a semiconductor memory device in which time necessary for selecting a memory cell in response to an external address signal is reduced.

A still further object of the present invention is to provide a semiconductor memory device in which the speed of transmission of the external address signal to the address decoder is improved.

A still further object of the present invention is to provide a semiconductor memory device in which the through current caused in the address buffer is reduced when the external address signal is switched.

A still further object of the present invention is to improve speed of transmission of the external address signal to address decoder, and to reduce through current caused in the address buffer at the time of switching the external address signal, in a semiconductor memory device having large storage capacity.

A still further object of the present invention is to reduce power consumption and to make shorter the access time in the semiconductor memory device in which address input pads are provided far apart from the address decoders.

In order to attain the above described objects, the semiconductor memory device in accordance with one aspect of the present invention includes a plurality of memory cells, address input pads for receiving external address signals designating any of the plurality of memory cells, buffer circuitry provided near the address input pads for buffering the external address signals supplied to the address input pads, and selecting circuitry for selecting any of the memory cells in response to an output signal from the buffer circuitry.

According to this aspect, since a buffering circuitry for buffering the external address signals is provided near the address input pads, the length of the interconnection layers connecting the address input pads to the buffer circuitry can be made shorter. Therefore, the capacitance and resistance of the interconnection layers can be reduced, so that the change in the external address signals can be immediately transmitted to the input end of the buffer circuitry.

According to another aspect of the present invention, the semiconductor memory device includes a plurality of memory cells arranged in a matrix of a plurality of rows and a plurality of columns, address input pads receiving time divisionally row address signals designating any of the plurality of rows and column address signals designating any of the plurality of columns, a column address buffer circuitry provided near the address input pads for buffering the column address signals supplied to the address input pads, a row address buffer circuitry for buffering the row address signals applied to the address input pads, a row selecting circuitry for selecting any of the rows in response to an output signal from the row address buffer circuitry, and a column selecting circuitry for selecting any of the columns in response to an output signal from the column address buffer circuitry.

In this aspect, preferably, switching circuitry is provided connected between the column address buffer circuitry and the address input pads. The switching circuitry is provided near the address input pads and electrically disconnects the address input pads from the row address buffer circuitry while the address input pads are receiving column address signals.

According to this aspect, a column address buffer circuitry for buffering the column address signals out of the external address signals is provided near the address input pads, and switching circuitry for electrically disconnecting the row address buffer circuitry for buffering the row address signals from the address input pads while the address input pads are receiving column address signals is provided near the address input pads. In this case, while the column address signals are applied to the address input pads, only a short interconnection layer provided between the address input pads and the column address buffer circuitry are electrically connected to the address input pads, and the interconnection layers connecting the switching means to the column address buffer circuitry are not electrically connected. Therefore, in such a period, the column address signals can be transmitted to the input end of the column address buffer circuitry at a high speed corresponding to the capacitance and the resistance of the short interconnection layers provided between the column address buffer circuitry and address input pads.

More preferably, each of the plurality of memory cells is a dynamic type memory cell, and a circuitry for activating the switching circuitry in a mode in which column address signals are supplied successively through the column address buffer circuitry to the column selecting circuitry while one of the plurality of rows is kept selected by the row selecting circuitry is further provided.

In this case, the time required for the plurality of memory cells arranged in the same row to be selected successively by the column selecting circuitry in a fast page mode or a static column mode in the DRAM can be reduced, because of the reduction of resistance and capacitance of the interconnection layers connecting the address input pads to the column address buffer. Therefore, the access time in such high speed operation mode can be further improved.

According to a further aspect of the present invention, the semiconductor device includes a plurality of dynamic memory cells arranged in a plurality of rows and a plurality of columns, and an address counter generates internal address signals for successively designating the plurality of rows for refreshing data in the plurality of memory cells, address input pads for time divisionally receiving column address signals for designating any of the plurality of rows and column address signals designating any of the plurality of columns, a column address buffer circuitry for buffering the column address signals, and a row address buffer circuitry for buffering the row address signals. Each of the column address signals and of the row address signals has a plurality bit length, and the address input pads include a plurality of pads (10a-10c) provided corresponding to the plurality of bits.

The column address buffer circuitry includes a plurality of first buffer circuits provided corresponding to the plurality of pads and each arranged near the corresponding pad.

The row address buffer circuit includes a plurality of second buffer circuits provided corresponding to the plurality of pads, each arranged near the address counter.

The semiconductor memory device further includes a column selecting circuitry for decoding output signals from the plurality of first buffers to select any of the plurality of columns, a row selecting circuitry for decoding the output signals from the plurality of second buffer circuits to select any of the plurality of rows, and a plurality of switching circuitry provided corresponding to the plurality of second buffer circuits.

Each of the plurality of switching circuitry is connected between the corresponding second buffer circuit and the pad corresponding to the corresponding second buffer circuit and near the corresponding pad, and it electrically disconnects the corresponding pad from the corresponding second buffer circuit while the corresponding pad is receiving the column address signal.

In accordance with a still further aspect, the present invention is a method of operating a semiconductor memory device including a plurality of memory cells arranged in a matrix of a plurality of rows and a plurality of columns and pads for receiving external signals, which method including the steps of receiving at said pad a row address signal designating any of the plurality of rows, buffering the received row address signal by using a row address buffer provided apart from the pad, selecting one of the plurality of rows in response to the buffered row address signal, receiving, after said row address signal is received by said pad, a column address signal designating any of the plurality of columns at said pad, buffering the received column address signal by using a column address buffer provided near the pad, successively selecting some of the plurality of columns in response to the buffered column address signals while the one row is being selected, and electrically disconnecting the pad from the row address buffer while the pad is receiving said column address signal.

Therefore, according to the present invention, the access time of the semiconductor memory device can be reduced, and power consumption in the address buffer is reduced. Therefore, the power consumption in the semiconductor memory device can be further decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
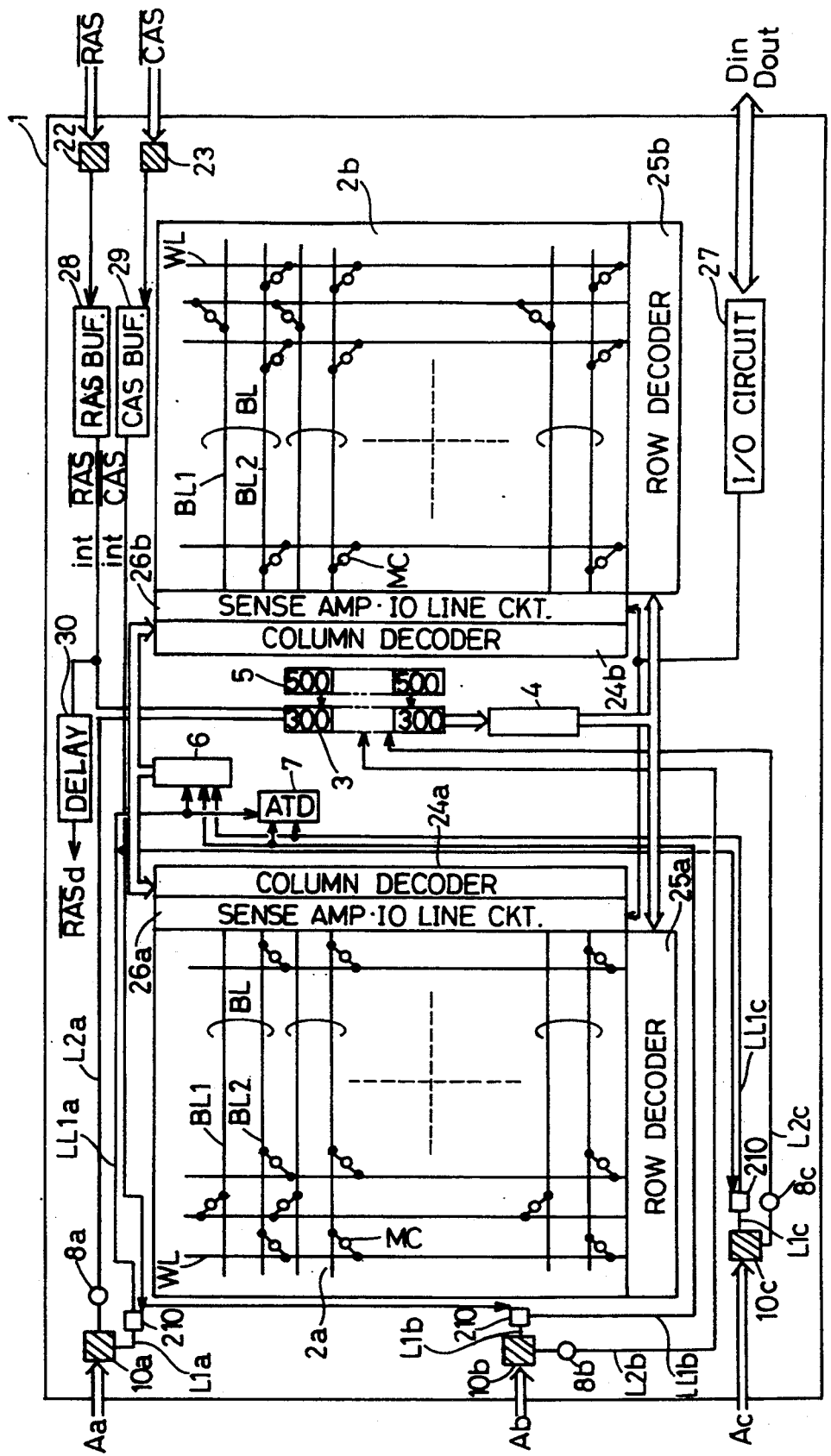
FIG. 1 is a schematic block diagram showing the whole structure of a DRAM in accordance with one embodiment of the present invention.

FIG. 1 is a schematic block diagram showing the whole structure of the DRAM in accordance with one embodiment of the present invention.

Figure 6:
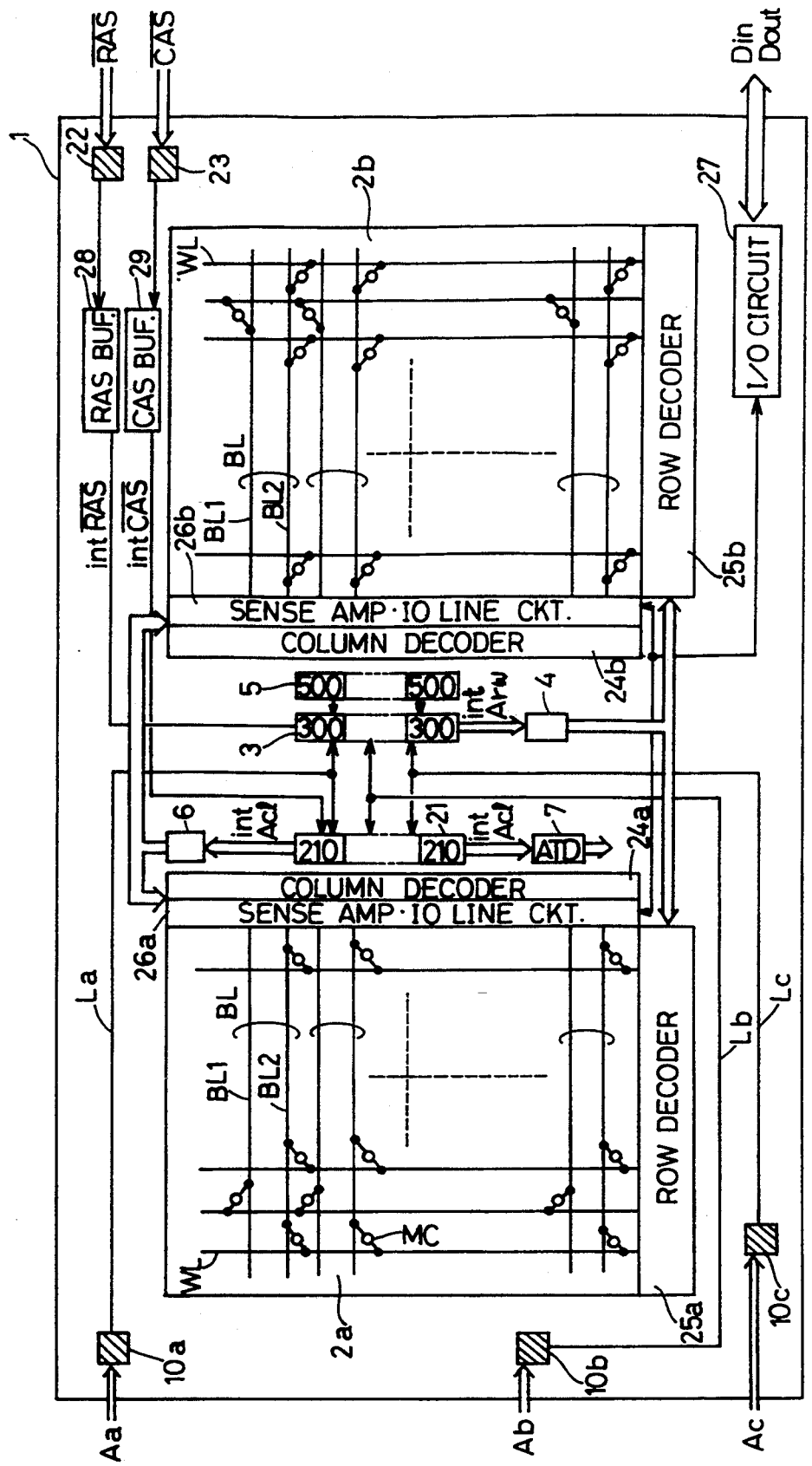
FIG. 6 is a schematic block diagram showing the whole structure of a conventional DRAM.
Figure 7:
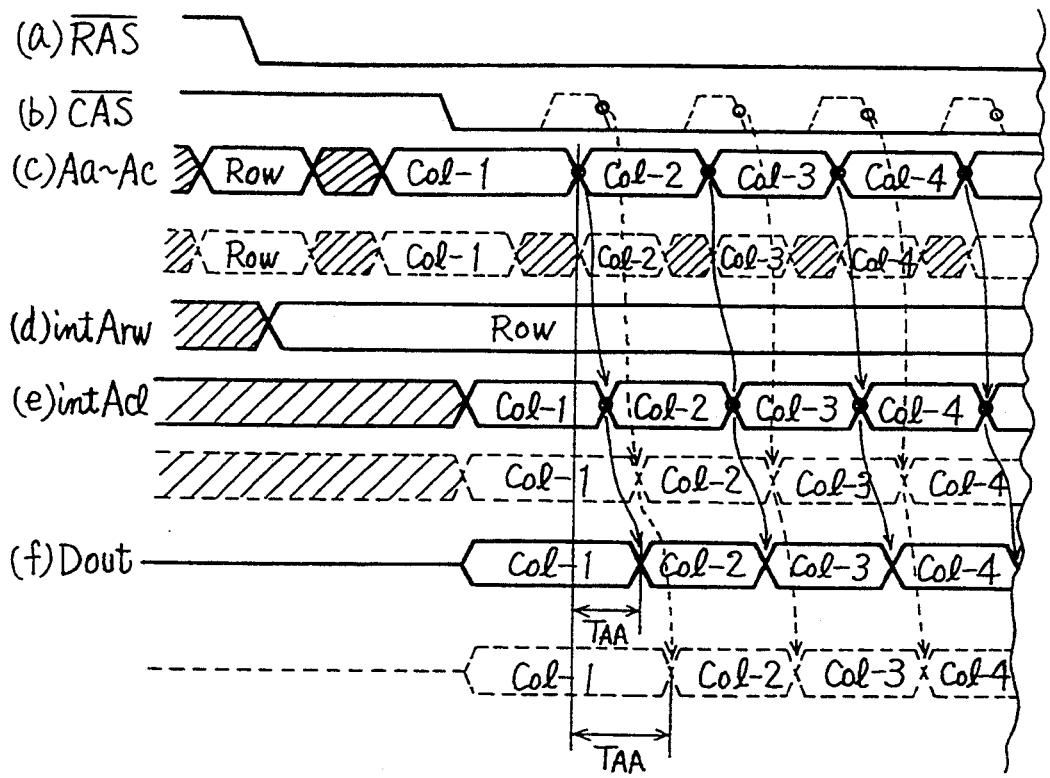
FIG. 7 is a timing chart showing the operation of the DRAM of FIG. 6 in the static column mode and fast page mode.

Referring to FIG. 1, in the DRAM 1 of the present embodiment, different from the conventional DRAM shown in FIG. 6, the buffer circuits 210 constituting the column address buffer 21 are arranged near the corresponding address input pads 10a-10c, switching circuits 8a-8c are provided between the address input pads 10a-10c and the corresponding buffer circuits 300 of the row address buffer 3, and a delay circuit 30 for controlling the switch circuits 8a-8c are provided. The switch circuits 8a-8c are arranged near the corresponding address input pads 10a-10c, respectively.

The operation and structure of other portions of the DRAM in accordance with this embodiment are the same as those of the conventional DRAM shown in FIG. 6. Therefore, description thereof is not repeated.

Figure 8:
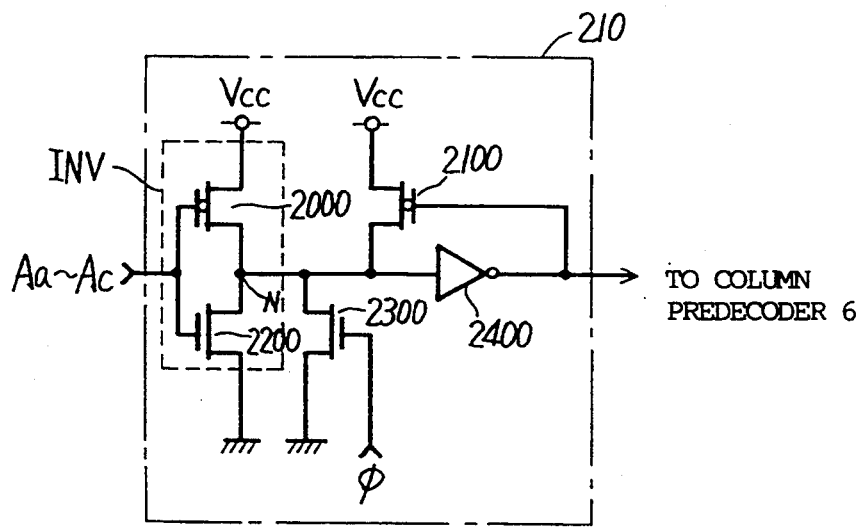
FIG. 8 is a schematic diagram showing a general structure of each buffer circuit constituting the column address buffer.

The structure of each buffer circuit 210 is as shown in FIG. 8.

In FIG. 1, three address input pads 10a-10c are shown as representatives as in the description of the prior art.

Since each buffer circuit 210 constituting the column address buffer 21 is provided near the corresponding address input pad, the length of the interconnection layers L1a-L1c connecting the buffer circuits 210 constituting the column address buffer 21 to the corresponding address input pads 10a-10c are shorter than in the prior art. Therefore, capacitance and resistance of each of the interconnection layers L1a-L1c are reduced than in the prior art.

Meanwhile, the address input pads Aa-Ac are connected to the corresponding buffer circuits 300 in the row address buffer 3 through corresponding switch circuits 8a-8c by means of the interconnection layers L2a-L2c which are independent from the aforementioned interconnection layers L1a-L1c.

Figure 2:
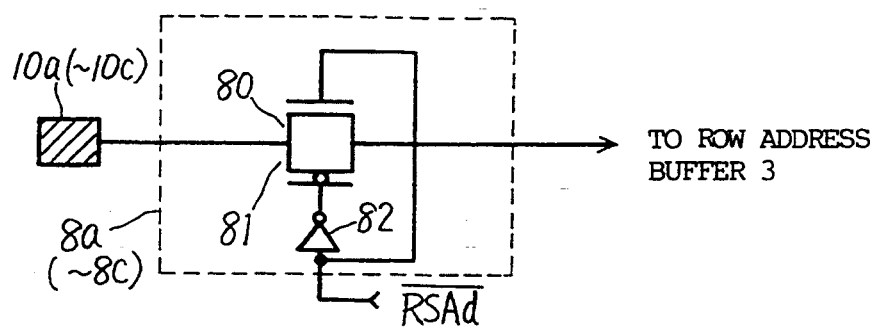
FIG. 2 is a schematic diagram showing an example of the structure of the switch circuit shown in FIG. 1.

FIG. 2 is a schematic diagram showing an example of the structure of each of the switch circuits 8a-8c. The structure of only one switch circuit is shown in FIG. 2 as a representative.

Referring to FIG. 2, each of the switch circuits 8a–8c includes an N channel MOS transistor 80, P channel MOS transistor 81 and an inverter 82 which are connected in parallel between the corresponding one of the address input pads 10a–10c and the corresponding one of the buffer circuits 300.

The inverter 82 inverts the output signal/RASd from the delay circuit 30 of FIG. 1. The output signal/RASd from the delay circuit 30 and the output signal from the inverter 82 are applied to the gates of the transistors 80 and 81, respectively.

Figure 3:
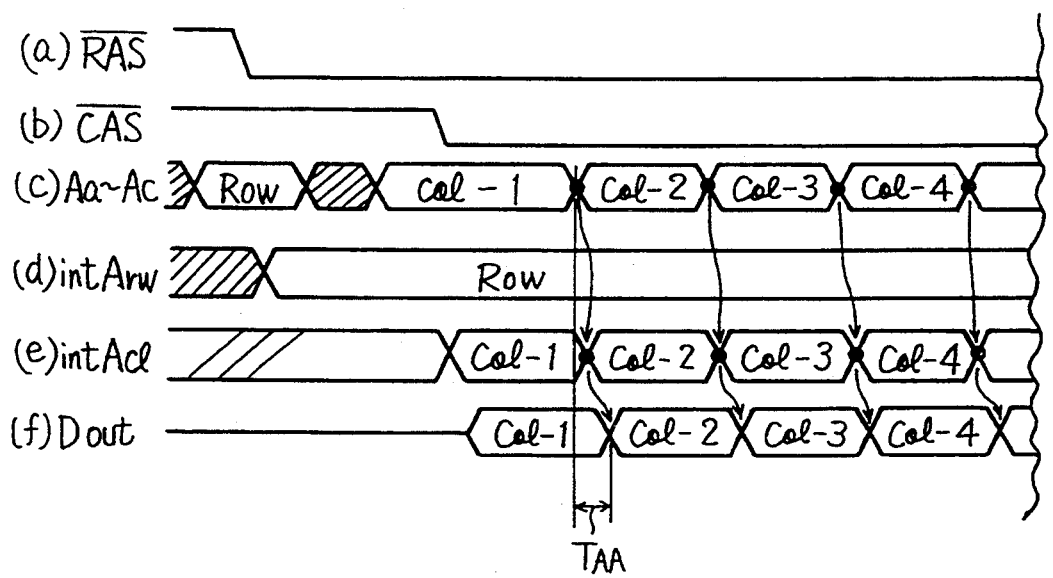
FIG. 3 is a timing chart showing the operation of the DRAM of FIG. 1 in a static column mode.

The operation of each of the switch circuits 8a–8c will be described with reference to FIGS. 2 and 3. FIG. 3 is a timing chart showing the changes of the external control signals/RAS,/CAS, internal control signals responsive thereto, and external address signals and internal address signals. FIG. 3 shows an example of a static column mode.

The delay circuit 30 provides a delay in the internal row address strobe signal int/RAS from the RAS buffer 28, and the signal/RASd provided therefrom to all switch circuits 8a–8c. Therefore, when the external row address strobe signal/RAS (FIG. 3(a)) falls to the low level, the signal/RASd (FIG. 3(b)) attains to the low level after a lapse of the delay time of the delay circuit 30 from the fall.

If the signal/RASd is at a high level, in each of the switch circuits 8a–8c the transistor 80 receives a high level potential at its gate to be turned ON, and the transistor 81 receives a low level potential at its gate to be turned ON.

Conversely, if the signal/RASd is at the low level, in each of the switch circuits 8a–8c the transistor 80 receives a low level potential at its gate to be turned OFF, and the transistor 81 receives a high level potential at its gate to be turned OFF.

Therefore, the switch circuits 8a–8c electrically connect the corresponding address input pads Aa–Ac to the interconnection layers L2a–L2c connected to the corresponding buffer circuits 300 in the row address buffer only during the period in which the output signal/RASd of the delay circuit 30 is at the high level, and in the period in which the signal/RASd is at the low level, the switch circuits 8a–8c electrically disconnect the corresponding address input pads Aa–Ac from the interconnection layers L2a–L2c connected to the corresponding buffer circuits 300 in the row address buffer 3.

Therefore, when the external low address strobe signal/RAS is switched to the low level, the external address signals Aa–Ac to the respective address input pads 10a–10c are not supplied to the row address buffer 3 after a delay of a prescribed time period from the time of the switching.

Meanwhile, the external column address strobe signal/CAS (FIG. 3(c)) falls later than the external row address strobe signal/RAS. The external address signals Aa–Ac (FIG. 3(d)) are set as the row address signal Row designating one row in each of the memory cell array blocks 2a and 2b at the fall of the external row address strobe signal/RAS, and thereafter when the external column address strobe signal/CAS is at the low level, they are switched to the column address signals Col-1, Col-2, ... successively, respectively indicating a plurality of columns of memory cells in each of the memory cell array blocks 2a and 2b.

The delay time in the delay circuit 30 is set at such a length that enables the signal/RASd to fall in a period from the time when the row address signal Row is stored in the row address buffer 3 to the fall of the external column address strobe signal/CAS. Consequently, the switch circuits 8a–8c are turned off after the external address signals Aa–Ac to the corresponding address input pads 10a–10c are completely taken in the corresponding buffer circuits 300 in the row address buffer 3 in response to the fall of the external row address strobe signal/RAS, thereby inhibiting transmission of the corresponding external address signals Aa–Ac to the row address buffer 3.

Even if transmission of the external address signals to the row address buffer 3 is inhibited, the internal row address signal intArw is fixed at the row address signal Row which has been taken previously as shown in FIG. 3(e), and therefore there is no problem.

Since all switch circuits 8a–8c are OFF while the external column address strobe signal/CAS is at the low level, each of the address input pads Aa–Ac is electrically connected to only the corresponding one of the buffer circuits 210 constituting the column address buffer. Since the buffer circuits 210 take the corresponding external address signals Aa–Ac in the similar manner as in the prior art, the internal column address signal intAcl is switched in response to the switching of the external address signals Aa–Ac, as shown in FIG. 3(f).

In the present embodiment, different from the prior art, the interconnection layers connected to the address input pads 10a–10c include interconnection layers L1a–L1c connecting the address input pads to the column address buffer 210 and interconnection layers L2a–L2c connecting the address input pads to a row address buffer 3, respectively.

However, the interconnection layers L2a–L2c connected to the row address buffer 3 are electrically disconnected from the corresponding address input pads 10a–10c, after the row address signal is to be taken by the row address buffer 3 is transmitted externally. Consequently, out of the interconnection layers connecting the address input pads Aa–Ac to the address buffers 3 and 210, only the interconnection layers L1a–L1c connected to the column address buffer 210 contribute to moderation of the waveform of the potential at the input end of the each column address buffer circuit 210 while the column address signal is applied to the address input pads 10a–10c as external address signals 10a–10c, respectively.

As described above, the interconnection layers L1a–L1c connecting the address input pads 10a–10c to the column address buffer 210, respectively, have small capacitance and small resistance in the present embodiment. Therefore, the output signal intAcl from each of the buffer circuits 210 constituting the column address buffer can be switched far quickly than in the prior art in response to the change of the level of the external address signals Aa–Ac to the corresponding address input pads 10a–10c. Therefore, in the period in which the external column address signal is to be taken in the column address buffer 210, the waveforms of the corresponding external address signals Aa–Ac appear more precisely than in the prior art at the input end of the inverter INV in each buffer circuit 210 (see FIG. 8).

Figure 4:
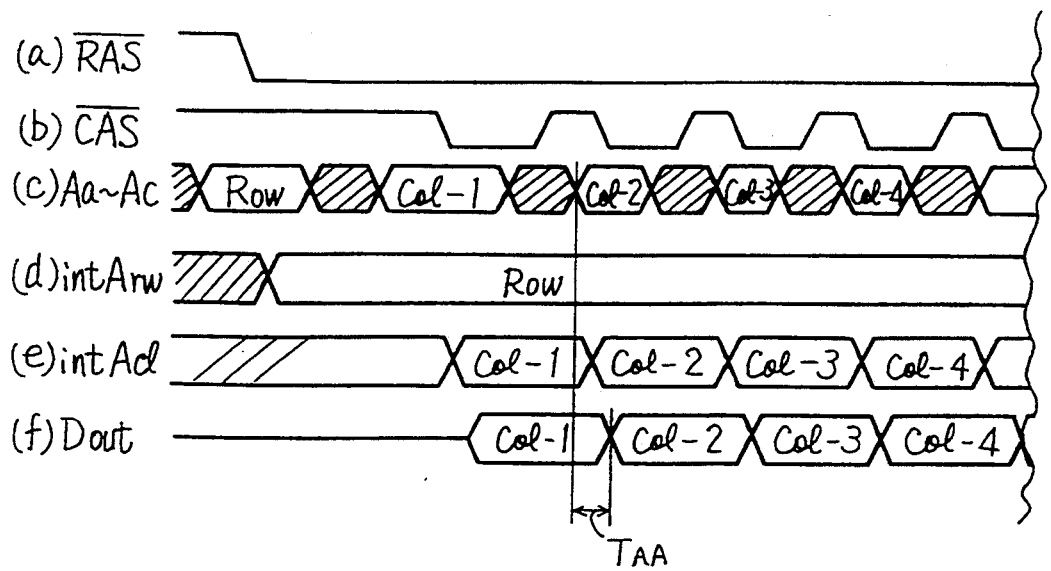
FIG. 4 is a timing chart showing the operation of the DRAM of FIG. 1 in a fast page mode.
Figure 5:
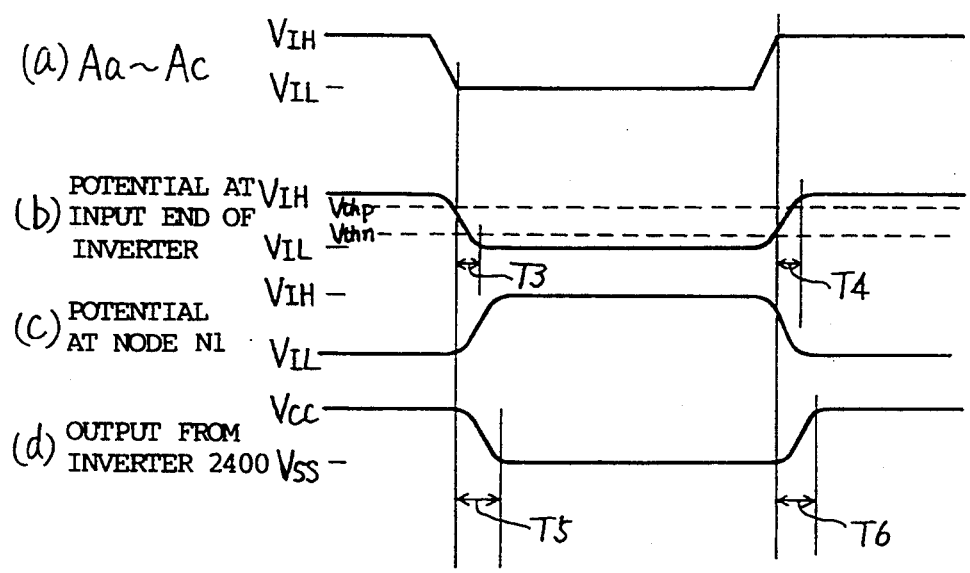
FIG. 5 is a timing chart showing relation between the waveform of the external address signal and the waveform of the output signal from the column address buffer in the DRAM of FIG. 1.

FIG. 4 is a timing chart showing the relation between the signal waveforms of the external address signals Aa–Ac and the signal waveform of the internal column address signal intAcl.

Referring to FIGS. 4 and 8, in a buffer circuit 210 (FIG. 8) provided corresponding to the address input pad 10a, for example, when the potential level at the input end of the inverter INV switches while the control signal φ is at the low level, the output potential level of the inverter 2400 switches in response.

When the external address signal Aa switches from the high level to the low level or from the low level to the high level as shown in FIG. 4(a), the potential at the input end of the inverter INV of the column address buffer 210 provided corresponding to the address input pad 10a lowers or increases at a speed corresponding to the magnitude of the capacitance and of the resistance of the interconnection layer L1a as shown in FIG. 4(b).

Figure 9:
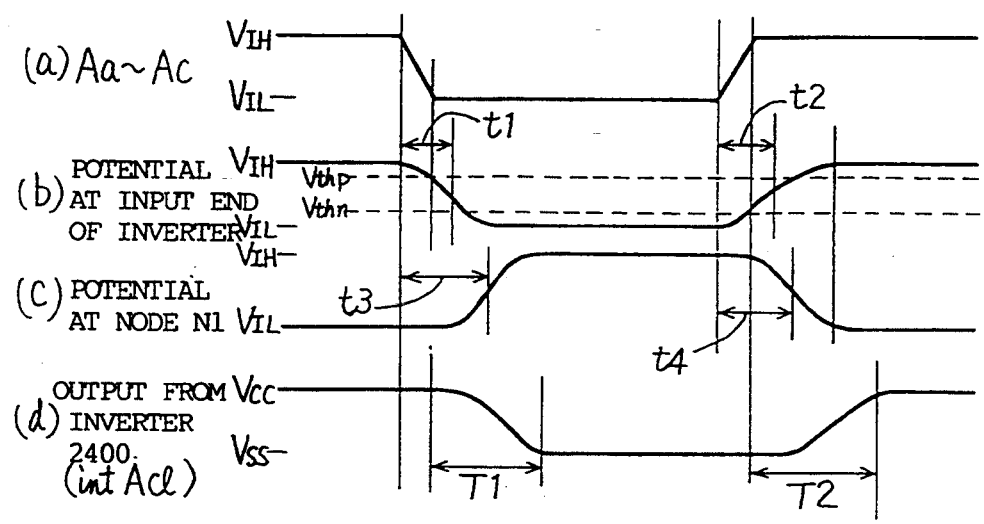
FIG. 9 is a timing chart showing relation between the waveform of the external address signal and the waveform of the output signal of the column address buffer in the DRAM shown in FIG. 6.

In the present embodiment, the interconnection layer L1a has small capacitance and small resistance. Therefore, the potential at the input end of the inverter INV lowers quickly than in the prior art, in response to the fall of the external address signal Aa, so that it reaches sooner to the low level potential $V_{IL}$ than in the prior art, and increases at higher speed than in the prior art in response to the rise of the external address signal Aa. Therefore, it reaches the high level potential $V_{IL}$ sooner than in the prior art. (see FIGS. 4 and 9)

More specifically, in the present embodiment, the time T3 from the switching of the external address signal Aa to the low level potential $V_{IL}$ to the time when the potential at the input end of the column address buffer 210 provided for buffering the external address signal Aa attains the low level potential $V_{IL}$, and the time T4 from the switching of the external address signal Aa to the high level potential $V_{IH}$ to the time when the potential at the input end of this buffer circuit 210 attains the high level potential $V_{IH}$ are shorter than in the prior art.

If the potential at the input end of the corresponding buffer circuit 210 changes from the high level potential $V_{IH}$ to the low level potential $V_{IL}$ in a short period of time in response to the fall of the external address signal Aa, the potential at the input end of the inverter INV becomes lower than the threshold value (generally 1.6 V) of the inverter INV quickly in response to the fall of the external address signal Aa. Therefore, the output potential from the inverter INV is changed to the high level potential $V_{IH}$ quickly in response to the fall of the external address signal Aa as shown in FIG. 4(c).

Similarly, when the external address signal Aa is switched to the high level, the potential at the input end of the inverter INV quickly exceeds the threshold value of the inverter INV in the corresponding buffer circuit 210 in response, and therefore the output potential of the inverter INV is quickly switched to the low level potential $V_{IL}$ in response to the rise of the external address signal Aa, as shown in FIG. 4(c).

Therefore, the output signal of the inverter 2400 in the column address buffer 210 provided corresponding to the address input pad 10a is switched to the low level potential Vss in a time period T5 which is shorter than the prior art from the switching of the external address signal Aa to the low level potential $V_{IL}$, and it is switched to the high level potential Vcc in a shorter time period T7 than in the prior art from the change of the external address signal Aa to the high level potential $V_{IH}$.

In other words, the signal waveform of the external address signal Aa is not made moderate but the signal is transmitted to the output end of the column address buffer 210 for buffering the external address signal.

To the output ends of other column address buffers 210, the signal waveforms of the external address signals Ab and Ac applied to the corresponding address input pads 10b and 10c are transmitted accurately based on the same principle.

The output signal intAcl from each buffer circuits 210 is supplied to the column predecoder 6 and to the ATD circuit 7 through independent interconnection layers LL1a–LL1c, respectively.

Since the buffer circuits 210 are provided near the corresponding address input pads 10a–10c, the interconnection layers LL1a–LL1c connecting the buffer circuits 210 to the column predecoder 6 and to the ATD circuit 7 become longer as the DRAM1 has larger capacity. However, the drivability of the buffer circuits 210 are set larger than the prior art corresponding to the capacitance and the resistance of the interconnection layers LL1a–LL1c connecting the buffer circuits to the column predecoder 6 and to the ATD circuit 7.

More specifically, the drivability of the buffer circuits 210 are determined such that the interconnection layers LL1a–LL1c connecting the buffer circuits to the column predecoder 6 and to the ATD circuit 7 are quickly charged or discharged in response to the change of the level of the output signal from the buffer circuits 210, whereby the potential level at the input ends of the column predecoder 6 and of the ATD circuit 7 is quickly changed.

The drivability of each buffer circuit 210 can be adjusted by changing the sizes of the transistors constituting the circuit, for example.

Referring to FIG. 6, for example, if the sizes of the transistors constituting the buffer circuit 210 are made larger, the current supplied to the corresponding one of interconnection layers LL1a–LL1c or the current drawn from the one interconnection layer by the inverter 2400 when the level of the gate potential of the transistors 2000 and 2200 is changed become larger, so that the driving capability of the buffer circuit 210 is enlarged.

Therefore, the signal waveform of the output signal intAcl of the column address buffer 210 can be transmitted to the column predecoder 6 and to the ATD circuit 7 accurately.

As described above, in the present embodiment, the change in the levels of the signals Aa–Ac which are externally applied as signals of respective bits constituting a column address signal can be transmitted to the column predecoder 6 and to the ATD circuit 7 more immediately than in the prior art. Therefore, the time from when the column address signal designating one row in each of the memory cell array blocks 2a and 2b is externally supplied to the time when one bit line pair provided corresponding to the column designated by the column address signal out of the bit line pairs BL in each of the memory cell array blocks 2a and 2b is electrically connected to the sense amplifier.IO line circuit 26a and 26b by the operation of the column predecoder 6 and of the ATD circuit 7 in response to the column address signal can be made shorter.

Consequently, in the static column mode or in the fast page mode, for example, the internal column address signal intAcl changes quickly than in the prior art in response to the change in the external address signals Aa–Ac which are applied as the column address signal in the period after the row address buffer 3 takes the external row address signal (see FIG. 3(f)).

Accordingly, in data reading, the output signal Dout from the input/output circuit 27 is switched to the data stored in one memory cell arranged at an intersection of the column designated by the switched external address signal and the row designated by the row address signal which has been taken in the address buffer 3, out of the memory cells MC in each of the memory cell array blocks 2a and 2b, faster than in the prior art in response to the switching of the external address signal (see FIG. 3(g)).

In data writing, in the period after the row address buffer 3 takes the external row address signal, the external data signal Din is immediately supplied to the bit line pair BL which is different from the one which has been selected in each of the memory cell array blocks 2a and 2b, in response to the switching of the external address signals Aa–Ac. Therefore, data is written immediately to the plurality of memory cells MC arranged at intersections of the plurality of columns successively designated by the external address signals and the row designated by this row address signal.

As described above, according to the present embodiment, the external address signal can be transmitted quickly to the column address buffer, and therefore access time in data writing and data reading can be reduced.

Further, in each of the buffer circuits 210 (see FIG. 8) constituting the column address buffer, the potential at the input end of the inverter INV quickly lowers and rises in response to the fall and rise of the corresponding external address signals Aa–Ac, so that power consumption in the buffer circuits 210 can be reduced.

Namely, the potential at the input ends of the buffer circuits 210 change from the high level potential $V_{IH}$ to the low level potential $V_{IL}$ in response to the switching of the corresponding external address signals Aa–Ac to the low level in a shorter time period, and the potential at the input ends of the buffer circuits 210 change from the low level potential $V_{IL}$ to the high level potential $V_{IH}$ in response to the switching of the corresponding external address signals Aa–Ac in a shorter time period, and therefore the time period in which the two transistors 2000 and 2200 constituting the inverter INV in each buffer circuit 210 are turned on, that is, the period in which the potential of the input end of the inverter INV is in the range from Vthn to Vthp is made shorter than in the prior art.

Therefore, the time in which through current flows through the inverter INV in each of the buffer circuits 210 in response to the change of the external address signals Aa–Ac is reduced, and hence the power consumption of the buffer circuits 210 can be reduced.

As described above, by the present embodiment, the power consumption of the DRAM 1 can be reduced.

Now, in the present embodiment, only the buffer circuits 210 constituting the column address buffer are provided near the corresponding address input pads, and the buffer circuits 300 constituting the row address buffer 3 are provided at the central portion of the DRAM chip 1 as in the prior art. The reason for this is that in case of a DRAM, the row address buffer 3 must receive output signals from the address counter 5 for refreshing.

If the buffer circuits 300 constituting the row address buffer 3 are provided near the corresponding address input pads 10a–10c, long interconnection layers connecting the buffer circuits 300 to the corresponding counters 500 in the address counter 5 and long interconnection layers for connecting the buffer circuits 300 to the row predecoder 4 are necessary. This increases the area of the DRAM chip 1, and it takes longer to transmit the signals output from the counters 500 to the row predecoder 4 for refreshing data in the memory cell array blocks 2a and 2b, which causes a problem that it takes longer to refresh data.

Therefore it is difficult to form buffer circuits 300 constituting the row address buffer 3 near the corresponding address input pads.

Therefore, in the present embodiment, the buffer circuits constituting the column address buffer are provided near the corresponding address input pads. Consequently, the time necessary for selecting one bit line pair in each memory cell array block in response to the external column address signal is made shorter. Therefore in the present embodiment, it is preferred to reduce the access time not by reducing the time necessary for selecting one row of memory cells for reading and writing data in response to the external row address signal in each of the memory cell array blocks 2a and 2b but by reducing the time necessary for selecting one column of memory cells for data reading and data writing in response to the external column address signal. Accordingly, in the present embodiment, the effect of reducing the access time is particularly conspicuous in the fast page mode and in the static column mode.

FIG. 4 shows timings of switching of the external control signals/RAS,/CAS, external address signals Aa–Ac, the internal column address signal intAcl, the internal row address signal intArw and the output data signal Dout in the fast page mode.

However, if the present invention is applied to a semiconductor memory device in which there is no problem caused by the provision of the row address buffer near the address input pad, the time necessary for selecting one row of memory cells in each memory cell array block in response to the external row address signal can be reduced by providing the buffer circuits constituting the row address buffer near the corresponding address input pads. Therefore, the present invention provides the same effect as in the present embodiment when it is applied to semiconductor memory devices other than DRAMs.

Further, the present invention can be applied to semiconductor memory devices in which the input pads for receiving row address signals and the input pads for receiving column address signals are different, and it provides the same effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix of a plurality of rows and a plurality of columns;
   an address input pad for time divisionally receiving a row address signal designating any of said plurality of rows and a column address signal designating any of said plurality of columns;
   column address buffer means provided proximate said address input pad for buffering said column address signal applied to said address input pad;
   row address buffer means for buffering said row address signal applied to said address input pad;
   row selecting means responsive to an output signal from said row address buffer means for selecting said any row;

column selecting means responsive to an output signal from said column address buffer means for selecting said any column; and switching means connected between said row address buffer means and said address input pad, said switching means electrically disconnecting said address input pad from said row address buffer means while said address input pad is receiving said external column address signal.

2. The semiconductor memory device according to claim 1, wherein each of said plurality of memory cells is a dynamic type memory cell;

said semiconductor memory device further comprising means for activating said switching means in a mode in which column address signals are successively supplied to said column selecting means through said column address buffer means while any one of said plurality of rows is kept selected by said row selecting means.

3. The semiconductor memory device according to claim 2, wherein said row address buffer means further has a function of storing said row address signal applied from said address input pad through said switching means in said mode.

4. The semiconductor memory device according to claim 3, wherein each of said column address signal and said row address signal has a plural bit length;

said address input pad includes a plurality of pads provided corresponding to said plural bits;

said column address buffer means includes a plurality of first buffer circuits provided corresponding to said plurality of pads;

said row address buffer means includes a plurality of second buffer circuits provided corresponding to said plurality of pads; and each of said plurality of first buffer circuits is arranged near the corresponding pad.

5. The semiconductor memory device according to claim 4, wherein said switching means includes a plurality of switch circuits provided corresponding to said plurality of second buffer circuits, and switch control means for collectively controlling said plurality of switch circuits, each of said plurality of switch circuits being connected between the corresponding one of the second buffer circuits and the pad provided corresponding to said corresponding second buffer circuit and being arranged near said corresponding pad.

6. The semiconductor memory device according to claim 5, receiving an external control signal for instructing said row address buffer means to take the row address signal, wherein said switch control means turns off said plurality of switch circuits after a prescribed time period, in response to said external control signal.

7. The semiconductor memory device according to claim 6, wherein said switch control means includes delay means for delaying said external control signal.

8. The semiconductor memory device according to claim 7, wherein each of said plurality of switch circuits includes a field effect semiconductor element having a first conduction terminal connected to an input end of the corresponding second buffer circuit, a second conduction terminal connected to the corresponding pad and a control terminal receiving an output signal from said delay means.

9. The semiconductor memory device according to claim 2, further comprising address counter means for generating internal address signals successively designating said plurality of rows for refreshing data in said plurality of memory cells, wherein said row address buffer means is arranged near said address counter means.

10. The semiconductor memory device according to claim 6, wherein the length of said prescribed time period is set such that said plurality of switch circuits are turned off after said external row address signal is stored by said row address buffer means.

11. The semiconductor memory device according to claim 6, wherein each of said first buffer circuits includes first inverting means for inverting a signal from the corresponding pad, second inverting means for inverting the potential at an output end of said first inverting means, holding means for holding constant the potential at said output end regardless of change in the level of the signal from said corresponding pad, and means for disabling said holding means in response to said external control signal.

12. The semiconductor memory device according to claim 7, wherein said plurality of first buffer means are connected to said column selecting means by a plurality of interconnection layers each having capacitance and resistance, respectively, and each of said plurality of first buffer means has driving capability corresponding to the value of the capacitance and the value of the resistance of the corresponding interconnection layer.

13. A method of operating a semiconductor memory device including a plurality of memory cells arranged in a matrix of a plurality of rows and a plurality of columns and a pad for receiving external signals, comprising the steps of:

receiving a row address signal designating any of said plurality of rows by said pad;

buffering said received row address signal by using a row address buffer provided apart from said pad;

selecting one of said plurality of rows in response to said buffered row address signal;

after receiving said row address signal by said pad, receiving a column address signal designating any of said plurality of columns by said pad;

buffering said received column address signal by using a column address buffer provided near said pad;

successively selecting some of said plurality of columns in response to said buffered column address signal while said one row is being selected; and electrically disconnecting said pad from said row address buffer while said column address signal is being received by said pad.

* * * * *